(12) United States Patent
Jaussi et al.

(10) Patent No.: US 6,756,841 B2
(45) Date of Patent: Jun. 29, 2004

(54) VARIABLE OFFSET AMPLIFIER CIRCUITS AND THEIR APPLICATIONS

(75) Inventors: James E. Jaussi, Hillsboro, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/099,551

(22) Filed: Mar. 15, 2002

(65) Prior Publication Data

US 2003/0174015 A1 Sep. 18, 2003

(51) Int. Cl.[7] ................................................ H03F 3/45
(52) U.S. Cl. ........................ 327/562; 330/258; 330/257
(58) Field of Search ................................ 327/562, 563, 327/560, 50, 65; 330/258, 253, 256, 257, 252, 259

(56) References Cited

U.S. PATENT DOCUMENTS

| | | | | |
|---|---|---|---|---|
| 3,916,333 | A | | 10/1975 | Zuk ............................ 330/259 |
| 4,647,839 | A | | 3/1987 | Siligoni et al. .............. 323/312 |
| 4,754,169 | A | | 6/1988 | Morris ......................... 307/491 |
| 4,987,327 | A | | 1/1991 | Fernandez et al. .......... 327/543 |
| 5,043,599 | A | | 8/1991 | Zitta ............................ 307/355 |
| 5,079,515 | A | | 1/1992 | Tanimoto ..................... 330/256 |
| 5,148,162 | A | | 9/1992 | Crosby ........................ 341/122 |
| 5,512,848 | A | | 4/1996 | Yaklin .......................... 327/65 |
| 5,517,134 | A | | 5/1996 | Yaklin .......................... 327/65 |
| 5,563,598 | A | | 10/1996 | Hickling ...................... 341/155 |
| 5,900,779 | A | | 5/1999 | Giacomini ................... 330/252 |
| 5,990,737 | A | * | 11/1999 | Czarnul et al. .............. 330/69 |
| 6,018,269 | A | | 1/2000 | Viswanathan ................ 330/254 |
| 6,163,215 | A | * | 12/2000 | Shibata et al. .............. 327/359 |
| 6,288,588 | B1 | * | 9/2001 | Frisch ......................... 327/280 |
| 6,348,882 | B1 | | 2/2002 | Ciccone et al. .............. 341/56 |
| 6,388,521 | B1 | | 5/2002 | Henry .......................... 341/56 |
| 6,396,329 | B1 | * | 5/2002 | Zerbe ........................... 327/51 |
| 6,420,932 | B1 | * | 7/2002 | Casper ......................... 330/258 |
| 6,469,576 | B2 | | 10/2002 | Hasegawa .................... 330/69 |
| 6,552,611 | B2 | | 4/2003 | Yamamoto ................... 330/253 |

OTHER PUBLICATIONS

Baker, *CMOS Circuit Design, Layout, and Simulation*, "Chapter 26: Nonlinear Analog Circuits," IEEE Press, pp. 685–699.

Ellersick et al., "GAD: A 12–GS/s CMOS 4–bit A/D Converter for an Equalized Multi–Level Link," *1999 Symposium on VLSI Circuits Digest of Technical Papers*, pp. 49–52.

Farjad–Rad et al., "A 0.3–μm CMOS 8–Gb/s 4–PAM Serial Link Transceiver," *IEEE J. Solid State Circuits*, 2000, 35(5):757–764.

Yang et al., "A Scalable 32Gb/s Parallel Data Transceiver with On–chip Timing Calibration Circuits," *2000 IEEE International Solid–State Circuits Conference*, Digest of Technical Papers, pp. 258–259.

* cited by examiner

*Primary Examiner*—Dinh T. Le
(74) *Attorney, Agent, or Firm*—Fish & Richardson P.C., P.A.

(57) ABSTRACT

A variable offset amplifier circuit includes two differential transistor pairs and a variable current generator coupled to each differential pair to control tail current. Each differential transistor pair has a first transistor and a second transistor. The first transistors are matched in size, as are the second transistors. The bias terminals of the first and second transistors serve as inputs to the amplifier circuit. The output of the amplifier circuit is associated with the differential pair output nodes of only similarly sized transistors, such that loads at the output of the amplifier circuit are sourced with current only from similarly sized transistors of the transistor pairs. The variable current generators may be adjusted to create offset in the output of amplifier circuit. The amplifier circuit has applications in a comparator circuit that also has a regenerative latch circuit, and as a sense amplifier in a receiver of a communications system.

26 Claims, 4 Drawing Sheets

VARIABLE OFFSET AMPLIFIER CIRCUITS AND THEIR APPLICATIONS

TECHNICAL FIELD

The invention is related to amplifier circuits having variable offset capability, and applications of such circuits.

BACKGROUND

Amplifier circuits are used to amplify an input electrical signal to provide current or voltage gains or reductions. They may be used to amplify a single ended or a differential signal. In addition, when used in conjunction with an output regenerative latch stage, they can provide a digital output signal (having one of two stable states) that is an indication of a comparison between two single ended input signals or a determination of the magnitude of a differential signal. A basic component of many amplifier circuits is the differential transistor pair used as the input stage of the amplifier.

Most practical implementations of amplifier circuits suffer from manufacturing process-induced variations in the structure of the circuit devices, which cause an offset in the amplifier's operation. The offset may be explained by, for instance, considering an amplifier that is designed to amplify a differential input signal. In some applications, the output of the amplifier would ideally be zero volts if the input differential signal was zero volts. However, in practice, a zero voltage differential signal often yields a small but nevertheless non-negligible output offset voltage. Output offset may be corrected using a wide range of techniques known as offset cancellation techniques. In one such technique, the value of the input differential signal that actually yields a zero output voltage is measured and stored, and then is subsequently subtracted from each new input signal to thus cancel the offset of the amplifier. In other applications of amplifier circuits, such as a pre-amplifier circuit in a comparator circuit, the amplifier circuit is designed to have a specified offset so that a comparison is indicated only when the offset is overcome.

The trend in circuit design is toward smaller and smaller device sizes, which serves not only to minimize space consumption, but also to minimize the capacitance and hence maximize the speed of circuits that incorporate the devices. However, with smaller device sizes, process-induced variations become more of an issue because the probability for process-induced variation in the structure of a device becomes greater as device size becomes smaller.

Amplification of differential signals is often required in the presence of fluctuating common-mode voltages or fluctuating power supply voltages. Because in some cases the signal to be amplified is a differential voltage signal, the amplifier's response to the common-mode voltage or to the power supply voltage produces an error at the output that is indistinguishable from the amplification at the output in response to the input signal. Common mode rejection ratio (CMRR) is conventionally defined as the magnitude of the ratio of differential-mode to common-mode gain, and power supply rejection ratio (PSRR) similarly is conventionally defined as the magnitude of the ratio of differential-mode to power supply gain. Measures of CMRR and PSRR are important benchmarks in circuit performance.

DESCRIPTION OF DRAWINGS

Like reference symbols in the various drawings indicate like elements.

DETAILED DESCRIPTION

The invention provides an amplifier circuit that introduces a variable offset, which may correct offset in amplifier operation caused by process-induced variations in the structure of circuit devices or induce a specified offset where that is needed for the application. The invention provides such a variable offset amplifier circuit that is configured to be relatively insensitive to changes in the common mode or power supply. The invention further provides circuit applications for the amplifier circuit, including for example, a variable offset comparator circuit and a communications system in which the variable offset comparator circuit is used.

Figure 1:
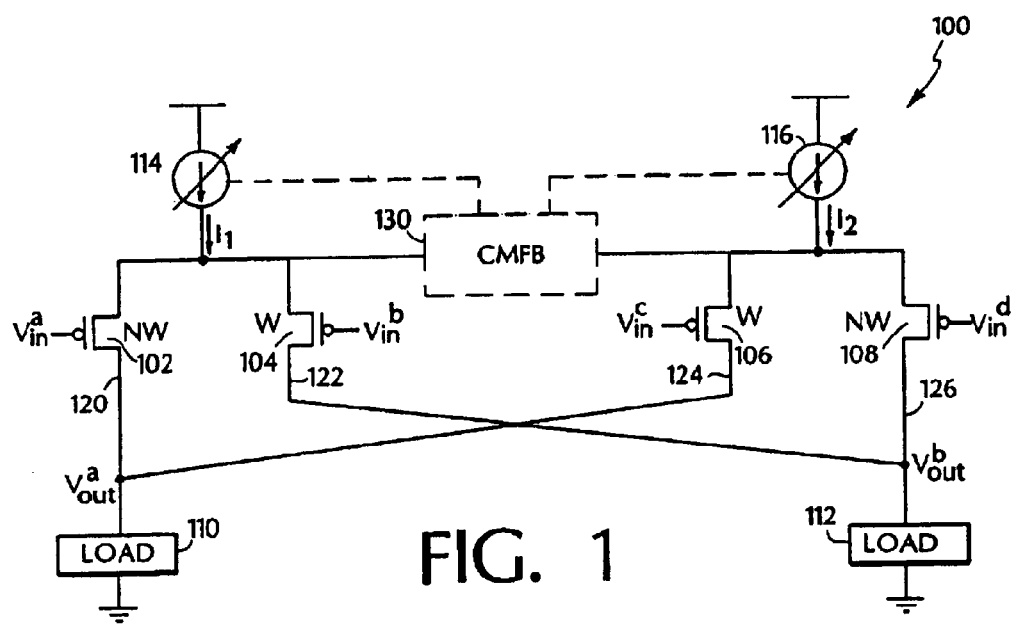
FIG. 1 is a schematic diagram of a variable offset amplifier circuit.

FIG. 1 shows an embodiment of a variable offset amplifier circuit 100 disclosed in commonly assigned U.S. patent application Ser. No. 09/895,625 to Bryan K. Casper, entitled "Variable Offset Amplifier Circuit," and filed on Jun. 29, 2001. This amplifier circuit 100 includes a first differential transistor pair 102, 104, and a second differential transistor pair 106, 108. Each pair is intentionally unbalanced. In this embodiment, the unbalanced characteristic is obtained by the transistor 102 being larger than the transistor 104 by a factor of N in the width of the transistor channel. Also, transistor 108 has a greater channel width than that of transistor 106, by, in this embodiment, the same factor N. The length of the transistor channels may be the same across all transistors in the amplifier circuit. The unbalanced characteristic may also be achieved using different lengths and similar widths for the transistors as is known in the art, or by using a combination of length and width variations. The first and second transistor pairs may be referred to as being inter-coupled to each other because output node 120 of the first pair is coupled to output node 124 of the second pair, while the output node 122 of the first pair is coupled to output node 126 of the second pair. Output nodes 120 and 126 are respectively coupled to load devices 110 and 112. These load devices may include passive and/or active circuits, depending on the application of the amplifier circuit. The load devices may alternatively represent a separate output amplification stage that provides an output signal at further output nodes of the stage.

The respective tail currents ($I_1$ and $I_2$) of the differential pairs are controlled by variable current generators 114 and 116 as shown. In this embodiment, variable current generators 114 and 116 are variable current sources that also pass the tail currents of the respective differential pairs. Other types of variable current generators to control the tail currents may alternatively be used, for example, current sinks.

The amplifier circuit 100 provides output voltages $V_{out}^a$ and $V_{out}^b$ in response to the input voltages $V_{in}^a$, $V_{in}^b$, $V_{in}^c$, and $V_{in}^d$. In an embodiment of the amplifier circuit, a difference output voltage $V_{out}^a - V_{out}^b$ is generated in response to the difference input voltages $V_{in}^a - V_{in}^b$ and $V_{in}^c - V_{in}^d$. Also, one difference input voltage, $V_{in}^+$, may serve as both $V_{in}^a$ and $V_{in}^c$, while another difference input voltage, $V_{in}^-$, may serve as both $V_{in}^b$ and $V_{in}^d$. The gain of the amplifier circuit 100 may be determined by a variety of factors, including the impedance $R_{load}$ of the load devices 110 and 112, and the transconductance $g_m$ of each transistor in the first and second differential pairs. The provision of variable non-zero offset by an embodiment of the amplifier circuit 100 of FIG. 1 may be explained by the following example.

Consider the situation where the input voltages are equal $V_{in}^a = V_{in}^b = V_{in}^c = V_{in}^d$. Also assume that the tail currents $I_1$ and $I_2$ are equal and the load impedances are equal. In such a configuration, the amplifier circuit 100 provides a nominal offset that will appear at the output as:

$$V_{out}^a - V_{out}^b = V_{nominal} \quad (1)$$
$$= \{[N/(N+1)]I_1 + [1/(N+1)]I_2\}R_{load} -$$
$$\{[N/(N+1)]I_2 + [1/(N+1)]I_1\}R_{load}$$
$$= 0.$$

Next, keeping the input voltages the same, if $I_1$ is increased and $I_2$ is decreased both by the same amount, namely $I_1 + \Delta I$ and $I_2 - \Delta I$, then $V_{out}^a$ changes to the following:

$$V_{out}^a = \{[N/(N+1)][I_1 + \Delta I] + \quad (2)$$
$$[1/(N+1)][I_2 - \Delta I]\}R_{load}$$
$$= \{I + [(N-1)/(N+1)]\Delta I\}R_{load}$$

Similarly, the new value of $V_{out}^b$ is given by:

$$V_{out}^b = \{[N/(N+1)][I_2 - \Delta I] + \quad (3)$$
$$[1/(N+1)][I_1 + \Delta I]\}R_{load}$$
$$= \{I - [(N-1)/(N+1)]\Delta I\}R_{load}$$

Finally, the difference voltage $V_{out}^a - V_{out}^b$ is given by:

$$V_{out}^a - V_{out}^b = [2(N-1)/(N+1)]\Delta I \, R_{load} \quad (4)$$

Thus, increasing $I_1$ and decreasing $I_2$ resulted in a decrease in the difference output voltage as given in the expression above. This decrease is the offset forced by the change in tail currents. Now, if the tail currents are changed in the reverse direction, that is if $I_1$ is decreased and $I_2$ is increased by the same amount, then following an analysis similar to that above gives the following expression:

$$V_{out}^a - V_{out}^b = -[2(N-1)/(N+1)]\Delta I \, R_{load} \quad (5)$$

which is an offset in the output voltage that is opposite in polarity to that given by equation (4). Thus, this example illustrates how opposite polarity offsets may be obtained in proportion to a differential change in the tail currents.

Continuing to refer to FIG. 1, to improve the common mode rejection of the amplifier circuit 100, a common mode feedback circuit (CMFB) 130 may be coupled to adjust the variable current generators 114, 116 in response to voltages of the first and second differential pairs. In the embodiment shown, the CMFB 130 detects the voltage at the output of the variable current generators 114 and 116 and in response adjusts the tail currents of the differential pairs by adjusting the variable current generators 114, 116.

Figure 2:
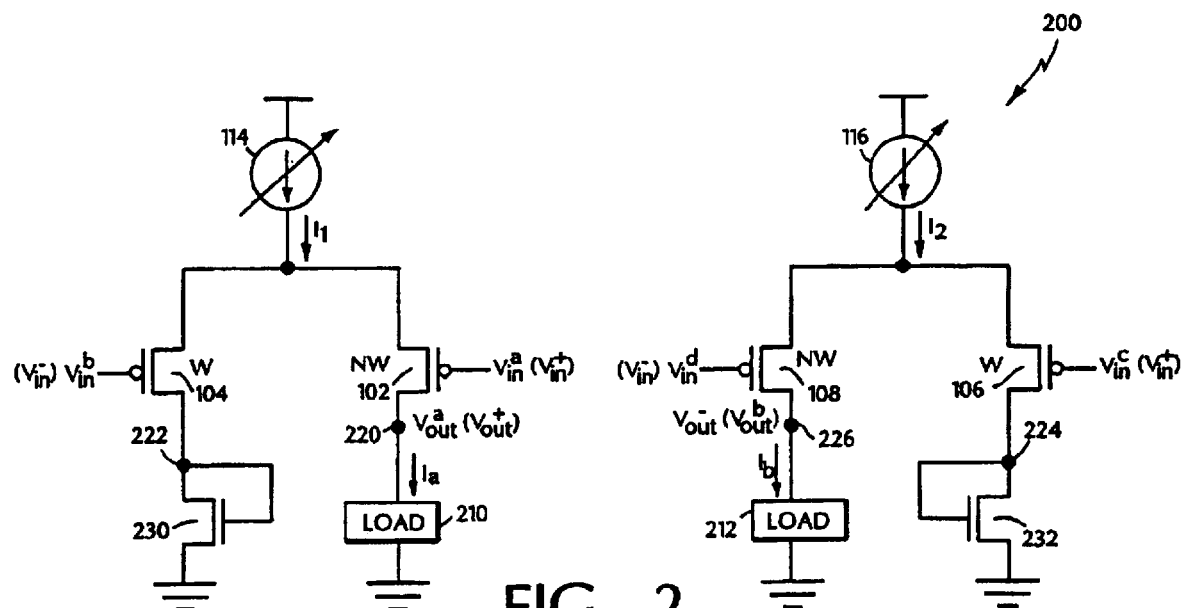
FIG. 2 is a schematic diagram of an embodiment of a variable offset amplifier circuit in accordance with the invention.

FIG. 2 shows an embodiment of an amplifier circuit 200 in accordance with the invention. The embodiment of the amplifier circuit 200 shown in FIG. 2 is implemented using p-channel metal oxide semiconductor field effect transistors (MOSFETs), as with the amplifier circuit 100 shown in FIG. 1. Also like the amplifier circuit 100 of FIG. 1, the amplifier circuit 200 of FIG. 2 includes a first differential transistor pair 102, 104, and a second differential transistor pair 106, 108, and each pair is intentionally unbalanced.

In the FIG. 2 amplifier circuit 200, only one output node of each transistor pair is coupled to the load devices 210 and 212. In the FIG. 2 embodiment, output node 220, which is the drain terminal of transistor 102, is coupled to load device 210, and output node 226, which is the drain terminal of transistor 108, is coupled to load device 212. On the other hand, output nodes 222 and 224 from, respectively, transistors 104 and 106 (specifically, the drain terminals of transistors 104 and 106), may be coupled, as shown in FIG. 2, respectively to the gate and drain terminals of diode-connected n-channel transistors 230 and 232, which in turn may have their source terminals coupled to ground. In other embodiments, output nodes 222 and 224 may be coupled directly to ground. Therefore, in these embodiments, transistors 104 and 106 do not source the output of the amplifier circuit 200.

As such, the loads 210 and 212 of the amplifier circuit 200 are sourced only by similarly sized transistors, namely transistors 102 and 108 that both have channel widths of NW. In this embodiment, N may be greater or less than one. For example, N may equal 0.1, 0.4, 0.8, 3, 8, etc. In other words, the amplifier circuit 200 output may be sourced by the two similarly sized smaller transistors of the differential pairs, or by the two similarly sized larger transistors of the differential transistor pairs.

The advantage of the FIG. 2 amplifier circuit 200 in comparison to the FIG. 1 amplifier circuit 100 becomes apparent by considering an example where each of the two differential pairs of the amplifier circuit 200 receives the same differential input signal, $V_{in}^+$ and $V_{in}^-$, and the amplifier circuit 200 amplifies that differential input signal. In this case, transistors 102 and 106 both receive $V_{in}^+$ at their gate terminals, and transistors 104 and 108 both receive $V_{in}^-$ at their gate terminals, as shown in FIG. 2 by the values in parentheses. In addition, the amplifier circuit 200 produces a differential output signal, where $V_{out}^a$ is $V_{out}^+$, and $V_{out}^b$ is $V_{out}^-$, as also shown in FIG. 2 by the values in parentheses.

As discussed previously, an adjustment to current sources 114 and 116 causes an offset in the voltage level of $V_{out}^+ - V_{out}^-$ when $V_{in}^+ - V_{in}^-$ equals zero. In one embodiment, for example, the offset is created by current source 114 being increased as current source 116 is reduced in the same amount. More tail current thus flows through transistor pair 102, 104, and less current through transistor pair 106, 108. An offset having the opposite polarity is produced by reducing the current level of current source 114 and increasing the current level of current source 116 in the same amount.

In the FIG. 2 amplifier circuit 200, loads 210 and 212 are sourced with current only by similarly sized transistors 102, 108, which have similar operating characteristics. The respective drain-to-source voltages ($V_{DS}$) of similarly sized transistors 102 and 108 will track each other in response to changes in the common mode and in the power supply, as will the drain currents of transistors 102 and 108, and thus $I_a$ and $I_b$. Therefore, the amplifier circuit 200 output terminals ($V_{out}^+$ and $V_{out}^-$) will be relatively insensitive to changes in the common mode or power supply.

By way of comparison, in the FIG. 1 amplifier circuit 100, loads 110 and 112 are sourced with current by transistors that differ in size. Load 110 is sourced by transistor 102 (size NW) and transistor 106 (size W), and load 112 is sourced by transistor 104 (size W) and transistor 108 (size NW). And the more that the offset is increased by differences in $I_a$ and $I_b$, the greater the percentage will be that the current sourced to load 110 will be sourced from a differently sized transistor than the current sourced to load 112. To illustrate, consider the extreme case of maximum offset adjustment to currents $I_1$ and $I_2$, where $I_1$ is twice the nominal current and $I_2$ is zero. In this case, load 110 is sourced with current only by transistor 102 (of size NW) and load 112 is sourced with current only by transistor 104 (of size W). No current will be sourced to the loads 110 and 112 through transistors 106 and 108. Because of the different operating characteristics for the differently sized transistors, the tracking of the transistors that are sourcing loads 110 and 112 in the presence of common mode or power supply variations will be reduced as the offset of currents $I_1$ and $I_2$ increases. That is not the case with the amplifier circuit 200 shown in FIG. 2, where loads 210 and 212 are sourced with current only by transistors that are similarly sized.

Figure 3:
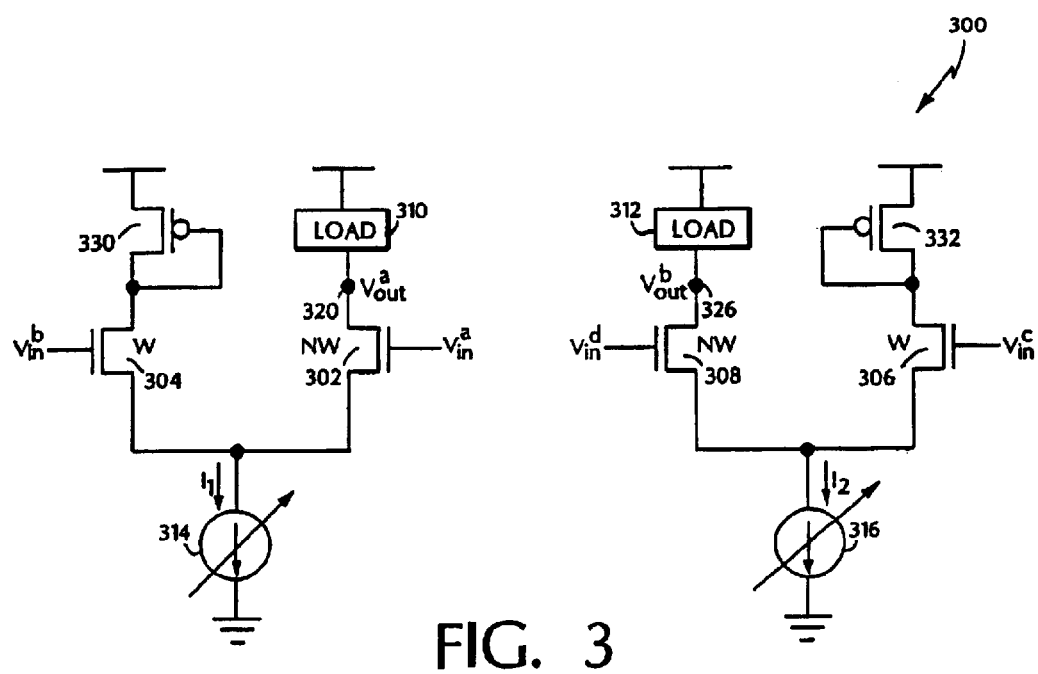
FIG. 3 is a schematic diagram of another embodiment of a variable offset amplifier in accordance with the invention.

Referring now to FIG. 3, another embodiment of an amplifier circuit 300 in accordance with the invention uses n-channel MOSFETs 302, 304 for the first differential pair and n-channel MOSFETs 306, 308 for the second differential pair. The variable current generators in this embodiment are current sinks 314 and 316 which control the tail currents of the differential transistor pairs, respectively. The output node 320 is coupled to a load 310 which in turn is coupled to a power supply node, whereas output node 326 is coupled to a load 312 which is also coupled to the power supply node. Thus, in contrast to the embodiment of FIG. 2, the amplifier circuit 300 in FIG. 3 has its load devices 210, 212 referenced to a power supply node rather than to a power return (that is, ground) node. Despite this difference, the same ability to adjust the offset in a manner that is relatively insensitive to common mode and power supply changes is present.

Figure 4:
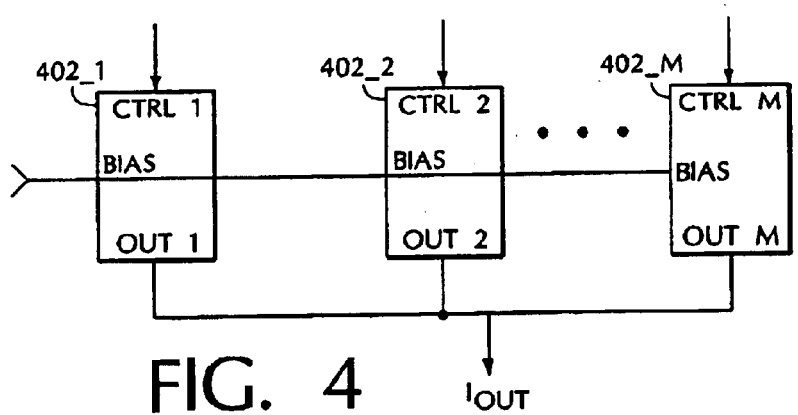
FIG. 4 is a schematic diagram of an embodiment of a current source that may be used with the circuits of FIGS. 1 and 2.

Referring to FIG. 4, this figure depicts a circuit schematic of an embodiment of a digitally controllable current source that can be used in place of the variable current generator 114 or 116 of FIG. 1 and FIG. 2. This current source has a number of digitally variable current cells 402_1, 402_2 . . . 402_M that are coupled in parallel to provide their individual currents which are summed to yield $I_{out}$. This output current $I_{out}$ may be the tail current of a differential transistor pair. Each individual cell current may be adjusted by varying a bias level in each cell, for example, using a binary weighted current set by a current mirror (not shown). The individual cell current may be turned on or off in response to a signal at a control input CTRL as shown. This control signal may be digital in nature, that is have one of two stable states corresponding to two levels of current at each individual cell's output. The total current may thus be adjusted by setting a digital value at the control inputs of the individual cells 402.

It should be noted that the output currents provided by the individual cells 402 may be unbalanced. For instance, some of the cells may provide larger currents (for course granularity control of the output current) while others may provide smaller currents (for fine granularity control of the output current $I_{out}$). Use of such digitally controllable current sources allows the offset of the amplifier circuit in FIGS. 1 and 2 to be trimmed digitally, by selecting the desired offset according to a multi-bit digital value.

Figure 5:
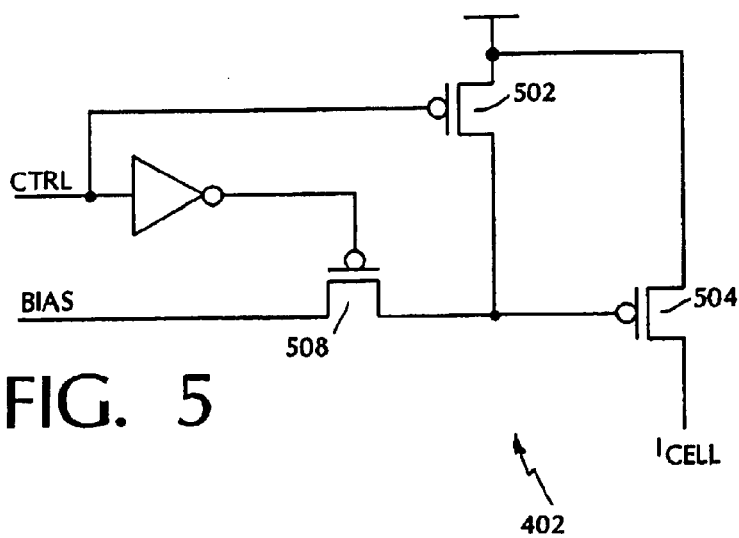
FIG. 5 is a schematic diagram of an embodiment of current source cell that may be used with the current source of FIG. 4.

FIG. 5 shows a circuit schematic of an embodiment of a digitally controllable current source cell 402. When the input signal at CTRL is at a relatively high voltage, such that the p-channel transistor 504 is biased according to an input bias signal at BIAS via p-channel transistor 508. In the other state, i.e., when the input signal at CTRL drops to a relatively low voltage such that p-channel transistor 502 has its channel inverted, the gate of the p-channel transistor 504 is pulled to a relatively high voltage that is sufficient to, in this embodiment, place the transistor 504 in cutoff. Thus, two different levels of cell current $I_{cell}$, e.g., "on" and "off," are obtained in response to the input control signal at CTRL. As mentioned in the previous paragraph, the various cells may be designed to provide different levels of "on" currents so that some may be used for fine granularity control of the total current $I_{out}$ (see FIG. 4) while others may be used for relatively course granularity control of this output current. Referring back to FIG. 5, the varying levels of "on" currents may be achieved by sizing the transistor 504 as known to those of ordinary skill in the art.

Figure 6:
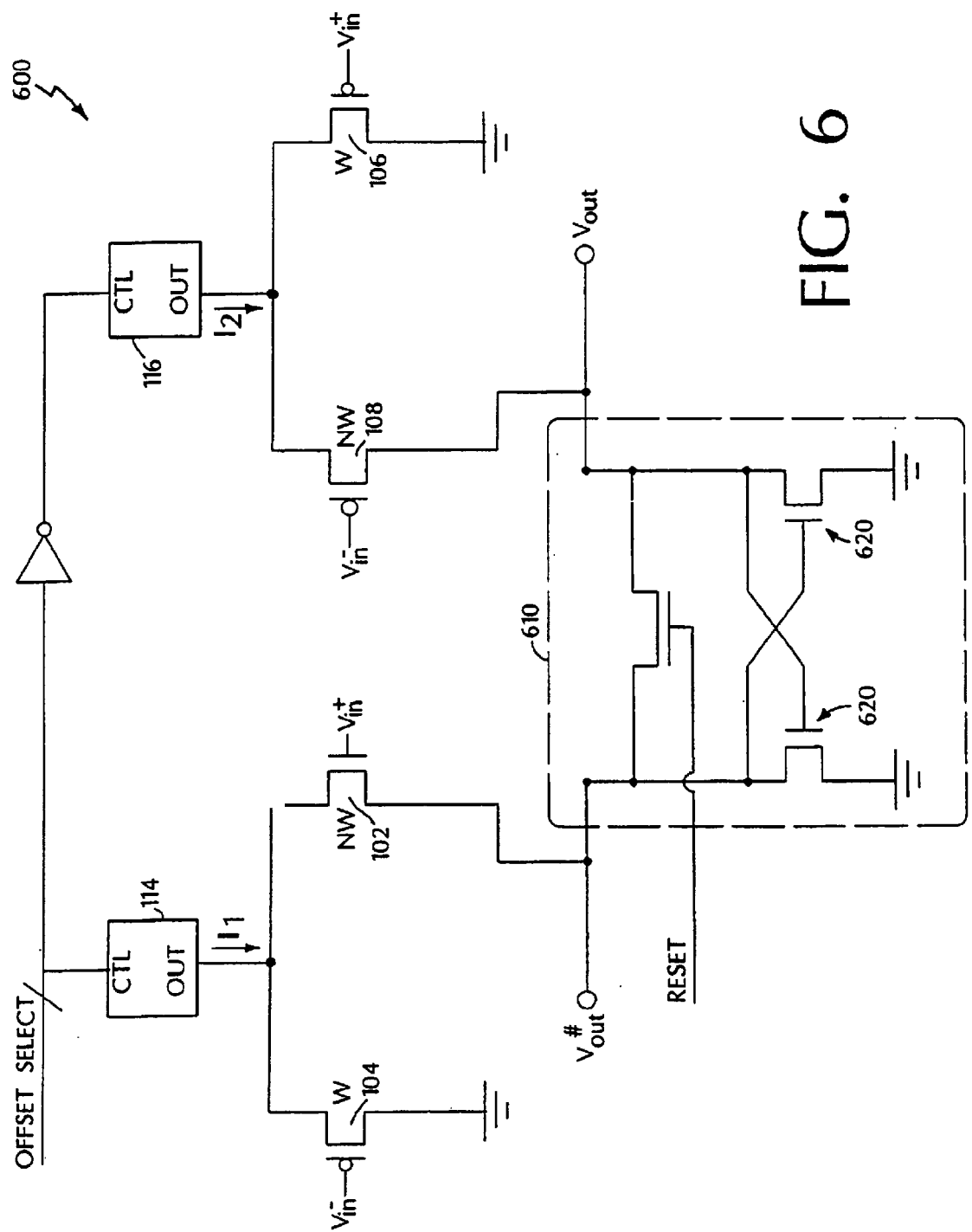
FIG. 6 is a schematic diagram of an embodiment of a variable offset comparator circuit in accordance with the invention.

FIG. 6 shows an embodiment of a digitally controllable variable offset comparator circuit 600 in accordance with the invention. The comparator circuit 600 includes an amplifier circuit substantially as shown in FIG. 2, including the first and second differential pairs which are defined by transistors 102, 104 and 106, 108, respectively. The variable current generators 114 and 116 are also coupled to control the tail currents $I_1$ and $I_2$ of the respective differential pairs. The current generators 114, 116 are controlled by a digital value that is received on multiple, offset select lines as shown. In this embodiment, each digital value of the offset corresponds to two oppositely varying tail currents $I_1$ and $I_2$ that are equidistant from a nominal tail current. This configuration is similar to the example given above in connection with FIG. 2 which helped explain the availability of opposite polarity offset using the amplifier circuit. The source terminals of transistors 104 and 106 may be coupled directly to ground, as shown in FIG. 6, or alternatively may be coupled to ground via two diode-coupled transistors, as was shown in FIG. 2.

A single ended output voltage for this comparator circuit 600 may be available as either $V_{put}^{\#}$ or $V_{out}$. To drive these output signals into one of two possible stable states, a regenerative load circuit 610 is provided as shown. After being reset by an input signal (RESET), this regenerative latch circuit 610 will quickly amplify any difference between $V_{out}^{\#}$ and $V_{out}$, where such amplification occurs at a relatively high gain due to the cross-coupled n-channel pair 620, thereby ensuring that the output signals $V_{out}^{\#}$ and $V_{out}$ only assume one of two possible stable states. Thus, if $V_{in}^+$ is greater than $V_{in}^-$ by at least the amount of offset that has been selected (for example by adjusting $I_1$ and $I_2$ as previously described), then the regenerative latch circuit 610 forcefully drives $V_{out}^{\#}$ to a high voltage level. Other types of regenerative latch circuits may be used to provide the digital type output signal typically associated with a sense amplifier for a comparator application. For example, the regenerative latch circuit may include the cross-coupled n-channel pair 620 coupled in parallel with a cross-coupled p-channel pair (not shown).

The variable offset comparator circuit 600 shown in FIG. 6 may behave as a sense amplifier which detects small differences between two analog signals $V_{in}^+$ and $V_{in}^-$. In this application, a pair of differential signals are sensed, where the first differential signal is applied to the first differential pair 102, 104, while an inverted version of the differential signal is applied to the second differential pair 108, 106. This signal definition assumes that $V_{in}^+$ is received at the gate of NW-sized transistor 102, as well as the gate of W-sized transistor 106. Similarly, $V_{in}^-$ is received at the gate of W-sized transistor 104 and the gate of NW-sized transistor 108. As mentioned previously, N may assume values greater than one and less than one, and thus transistors 102 and 106 may be larger than transistors 104 and 108, or vice versa.

Figure 7:
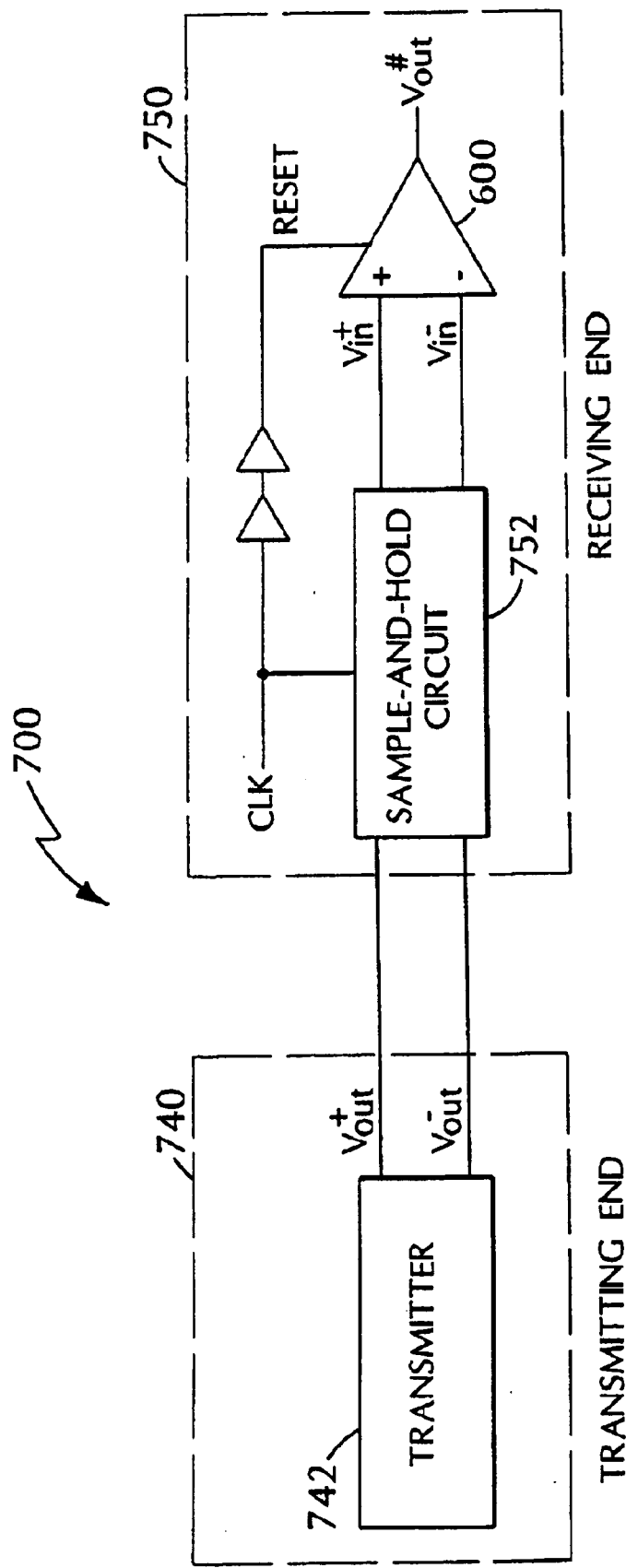
FIG. 7 is a block diagram of a communications system applying the comparator circuit of FIG. 6.

FIG. 7 shows a communications system 700 having the comparator circuit 600 of FIG. 6 in a sense amplifier application. The transmission end of the communication system 700 may reside on a separate integrated circuit die or separate circuit board, for example, as depicted by block 740 having a transmitter 742 with differential outputs $V_{out}^+$ and $V_{out}^-$. These differential output signals are received by a sample-and-hold circuit 752 that may reside, as shown in FIG. 7, on a separate integrated circuit die or separate board as depicted by block 750. A clock signal CLK determines the timing of when the differential signal is sampled, and a delayed clock signal RESET determines the timing of when the sampled-and-held differential signal is compared by comparator circuit 600. If $V_{in}^+$ is greater than $V_{in}^-$ by at least the amount of offset that has been selected, then the output $V_{out}^\#$ of the comparator circuit 600 will be driven to a high voltage level.

To summarize, the invention provides variable offset amplifier circuits and variable offset comparator circuits with improved CMRR and PSRR compared to other designs of such circuits. As such, the linearity of response in these circuits is improved. In many cases the improved CMRR and PSRR will avoid the need for a CMFB circuit of the type shown in FIG. 1, which increases the speed at which the circuit operates. In addition, improved CMRR and PSRR is advantageous in the testing a comparator circuit's sensitivity. For example, with a more linear relationship, it is possible to more accurately determine the sensitivity level at which the comparator circuit was no longer able to sense a given signal, and thus it is possible to more accurately determine the bandwidth limit of the comparator.

A number of embodiments have been described. Nevertheless, it will be understood that various modifications may be made without departing from the spirit and scope of the invention. Accordingly, other embodiments are within the scope of the following claims.

What is claimed is:

1. An amplifier circuit comprising:
   first and second differential transistor pairs, each pair having a first transistor and a second transistor, the first transistors being matched in size and the second transistors being matched in size, each transistor having a bias terminal and an output node, the bias terminals of the first transistors serving as inputs to the amplifier circuit, and an output of the amplifier circuit being associated with the output nodes only of the first transistors;
   a first variable current generator coupled to control a tail current of the first differential pair and not controlled by the inputs to the amplifier circuit; and
   a second variable current generator coupled to control a tail current of the second differential pair and not controlled by the inputs to the amplifier circuit.

2. The amplifier circuit of claim 1, wherein the first transistors are larger than the second transistors.

3. The amplifier circuit of claim 2, wherein the first differential transistor pair is to receive an input signal at the first and second transistors of that pair, and the second differential transistor pair is to receive an inverted version of the input signal at the first and second transistors of that pair.

4. The amplifier circuit of claim 2, wherein:
   the first current generator has circuitry that receives a signal that sets a level for the first tail current; and
   the second current generator has circuitry that receives a signal that sets a level for the second tail current.

5. The amplifier circuit of claim 4, wherein the variable current generators are settable so that the levels for the tail currents are equally and oppositely offset from a nominal current level.

6. The amplifier circuit of claim 1, wherein the first transistors are smaller than the second transistors.

7. The amplifier circuit of claim 6, wherein the first differential transistor pair is to receive an input signal at the first and second transistors of that pair, and the second differential transistor pair is to receive an inverted version of the input signal at the first and second transistors of that pair.

8. The amplifier circuit of claim 6, wherein:
   the first current generator has circuitry that receives a signal that sets a level for the first tail current; and
   the second current generator has circuitry that receives a signal that sets a level for the second tail current.

9. The amplifier circuit of claim 8, wherein the variable current generators are settable so that the tail currents are set to current levels that are equally and oppositely offset from a nominal current level.

10. The amplifier circuit of claim 1, wherein the transistors of the differential pairs are p-channel MOSFET transistors.

11. The amplifier circuit of claim 1, wherein the transistors of the differential pairs are n-channel MOSFET transistors.

12. The amplifier circuit of claim 1, further comprising first and second diode-connected transistors coupled respectively to the first and second differential transistor pairs and through which currents not associated with the amplifier output flow.

13. A comparator circuit comprising:
   (a) a pre-amplifier circuit comprising:
      (1) first and second differential transistor pairs, each pair having a first transistor and a second transistor, the first transistors being matched in size and the second transistors being matched in size, each transistor having a bias terminal and an output node, the bias terminals of the first transistors serving as inputs to the pre-amplifier circuit, and an output of the pre-amplifier circuit being associated with the output nodes only of the first transistors;
      (2) a first variable current generator coupled to control a tail current of the first differential pair and not controlled by the inputs to the pre-amplifier circuit; and
      (3) a second variable current generator coupled to control a tail current of the second differential pair and not controlled by the inputs to the pre-amplifier circuit; and
   (b) a regenerative latch circuit coupled to the output of the pre-amplifier circuit.

14. The comparator circuit of claim 13, wherein the first transistors are larger than the second transistors.

15. The comparator circuit of claim 14, wherein the first differential transistor pair is to receive an input signal at the first and second transistors of that pair, and the second differential transistor pair is to receive an inverted version of the input signal at the first and second transistors of that pair.

16. The comparator circuit of claim 14, wherein:
the first current generator has circuitry that receives a signal that sets a level for the first tail current; and
the second current generator has circuitry that receives a signal that sets a level for the second tail current.

17. The comparator circuit of claim 16, wherein the variable current generators are settable so that the levels for the tail currents are equally and oppositely offset from a nominal current level.

18. The comparator circuit of claim 13, wherein the first transistors are smaller than the second transistors.

19. The comparator circuit of claim 18, wherein the first differential transistor pair is to receive an input signal at the first and second transistors of that pair, and the second differential transistor pair is to receive an inverted version of the input signal at the first and second transistors of that pair.

20. The comparator circuit of claim 18, wherein:
the first current generator has circuitry that receives a signal that sets a level for the first tail current; and
the second current generator has circuitry that receives a signal that sets a level for the second tail current.

21. The comparator circuit of claim 20, wherein the variable current generators are settable so that the tail currents are set to current levels that are equally and oppositely offset from a nominal current level.

22. The comparator circuit of claim 13, wherein the pre-amplifier circuit further comprises first and second diode-connected transistors coupled respectively to the first and second differential transistor pairs and through which currents not associated with the amplifier output flow.

23. A communications system comprising:
(a) a transmitter producing a differential voltage signal;
(b) a receiver comprising:
(1) a sample-and-hold circuit that receives the differential voltage signal and samples and holds values of the differential voltage signal; and
(2) a comparator circuit comprising:
(i) a pre-amplifier circuit comprising:
(a) first and second differential transistor pairs, each pair having a first transistor and a second transistor, the first transistors being matched in size and the second transistors being matched in size, each transistor having a bias terminal and an output node, the bias terminals of the first transistors serving as inputs to the pro-amplifier circuit, and an output of the pre-amplifier circuit being associated with the output nodes only of the first transistors;
(b) a first variable current generator coupled to control a tail current of the first differential pair and not controlled by the inputs to the pre-amplifier circuit; and
(c) a second variable current generator coupled to control a tail current of the second differential pair and not controlled by the inputs to the pre-amplifier circuit; and
(ii) a regenerative latch circuit coupled to the output of the pro-amplifier circuit.

24. The communications system of claim 23, wherein the transmitter and the receiver reside on different circuit boards.

25. The communications system of claim 23, wherein the transmitter and the receiver reside on different integrated circuit die.

26. The communications system of claim 23, wherein the first differential transistor pair receives the differential voltage signal at the first and second transistors of that pair, and the second differential transistor pair receives an inverted version of the differential voltage signal at the first and second transistors of that pair.

* * * * *